(12) United States Patent
Takahashi

(10) Patent No.: US 7,388,287 B2
(45) Date of Patent: Jun. 17, 2008

(54) SEMICONDUCTOR PACKAGE

(75) Inventor: Norio Takahashi, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 272 days.

(21) Appl. No.: 11/350,745

(22) Filed: Feb. 10, 2006

(65) Prior Publication Data

US 2006/0208181 A1 Sep. 21, 2006

(30) Foreign Application Priority Data

Mar. 18, 2005 (JP) .............................. 2005-079766

(51) Int. Cl.
*H01L 23/34* (2006.01)
(52) U.S. Cl. ...................... 257/724; 257/433
(58) Field of Classification Search ................ 257/723, 257/724, 686, 777, 433, 434, 414, 467
See application file for complete search history.

(56) References Cited

U.S. PATENT DOCUMENTS 5,898,218 A * 4/1999 Hirose et al. ............... 257/710
5,901,046 A * 5/1999 Ohta et al. ................. 361/760
5,907,178 A * 5/1999 Baker et al. ................ 257/433
6,559,539 B2* 5/2003 Tu et al. .................... 257/723
2006/0214288 A1* 9/2006 Ohsumi ..................... 257/724

FOREIGN PATENT DOCUMENTS

JP 09-089925 4/1997

* cited by examiner

*Primary Examiner*—S. V Clark
(74) *Attorney, Agent, or Firm*—Kubotera & Associates, LLC

(57) ABSTRACT

A semiconductor package includes a base plate; a sidewall provided at a periphery of the base plate; a sensor chip retained in a chip accommodation space defined by the sidewall; and a chip installation hole provided in the base plate for installing the sensor chip. The sensor chip is disposed in the chip installation hole provided in the base plate of the case. Accordingly, it is possible to reduce a thickness of the semiconductor package without changing a thickness of the sensor chip. The base plate has a relatively large thickness except for the chip installation hole. Accordingly, even when the semiconductor package is made thinner, rigidity of the base plate is maintained, thereby minimizing a strain in the base plate.

19 Claims, 5 Drawing Sheets

United States Patent US 7,388,287 B2

SEMICONDUCTOR PACKAGE

BACKGROUND OF THE INVENTION

The present invention relates to a semiconductor package having a case for enclosing a senor chip in a chip accommodation space, wherein the sensor chip includes, for example, a semiconductor acceleration sensor with a flexible portion supporting a plump bob.

A conventional semiconductor package for a semiconductor acceleration sensor is disclosed in, for example, Japanese Patent Publication No. 09-89925. The conventional semiconductor package comprises a resin case composed of a base plate and a sidewall provided at the periphery of the base plate. A sensor chip, or a semiconductor acceleration sensor, having a flexible portion supporting a plump bob and a signal processing chip are provided on a front surface of the base plate. The sensor chip and the signal processing chip are connected to a lead frame by wirings. A resin lid is fixed to the resin case to enclose the sensor chip and the signal processing chip in a chip accommodation space. An end portion of the lead frame is bent at an edge of the base plate of the resin case to form an outer terminal on a back surface of the base plate.

Patent Reference: Japanese Patent Publication No. 09-89925

In the conventional semiconductor package, the sensor chip and the signal processing chip are provided on the front surface of the base plate of the resin case and enclosed by the resin lid. In this configuration, a thickness of the semiconductor package is a sum of a thickness of the base plate, a height of the chip accommodation space, and a thickness of the resin lid. When the base plate of the resin case is made thin to reduce the thickness of the semiconductor package, the base plate becomes less rigid, so that the base plate may be strained under heat or upon receiving an external force. When the base plate is strained, the flexible portion supporting the plump bob of the sensor chip may be strained, thereby affecting characteristics of the sensor chip.

In the semiconductor acceleration sensor, it is necessary to provide the plump bob with a specific weight to improve accuracy of acceleration measurement. Accordingly, it is difficult to reduce the thickness of the sensor chip as opposed to other semiconductor chips. Consequently, the height of the chip accommodation space is dominantly determined by the thickness of the sensor chip, thereby making it difficult to reduce the thickness of the semiconductor package of the semiconductor acceleration sensor.

In view of the problems described above, an object of the present invention is to provide a semiconductor package with a small thickness for accommodating a sensor chip. Another object of the present invention is to provide a semiconductor package for accommodating a sensor chip, in which it is possible to reduce a strain in a base plate of the semiconductor package.

Further objects will be apparent from the following description of the invention.

BRIEF SUMMARY OF THE INVENTION

In order to achieve the objects described above, according to a first aspect of the present invention, a semiconductor package comprises a base plate; a sidewall provided at a periphery of the base plate; a sensor chip retained in a chip accommodation space defined by the sidewall; and a chip installation hole provided in the base plate for installing the sensor chip.

In the first aspect of the present invention, the sensor chip is disposed in the chip installation hole provided in the base plate of the case. Accordingly, it is possible to reduce a thickness of the semiconductor package without changing a thickness of the sensor chip. The base plate has a relatively large thickness except for the chip installation hole. Accordingly, even when the semiconductor package is made thinner, rigidity of the base plate is maintained, thereby minimizing a strain in the base plate.

According to a second aspect of the present invention, a semiconductor package comprises a base plate having a front surface and a back surface opposite to the front surface; a sidewall provided at a periphery of the base plate; a sensor chip retained in a chip accommodation space defined by the sidewall; a sensor chip installation region provided on the front surface of the base plate for installing the sensor chip; and at least one outer terminal provided on the back surface of the base plate except for an area corresponding to an area of the sensor chip installation region on the front surface. The outer terminal relays a signal between the semiconductor package and an outer circuit.

According to the second aspect of the present invention, the outer terminal is provided on the back surface of the base plate at a position except for the area corresponding to the sensor chip installation region on the front surface. Accordingly, even if the base plate has a relatively small thickness, it is possible to prevent various outer forces from a mounting board from being directly applied to the sensor chip after the semiconductor package is soldered to the mounting board. Further, it is possible to reduce a strain in the base plate in the sensor chip installation region, thereby reducing an influence of an external force on the sensor chip.

DETAILED DESCRIPTION OF PREFERRED EMBODIMENTS

Hereunder, embodiments of the present invention will be described below with reference to the accompanying drawings.

First Embodiment

Figure 1:
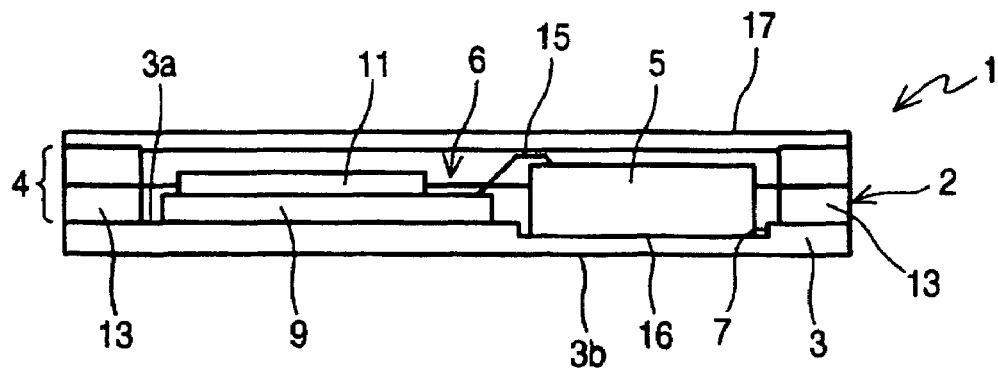
FIG. 1 is a sectional view of a semiconductor package according to a first embodiment of the present invention taken along a line 1-1 in FIG. 2.
Figure 2:
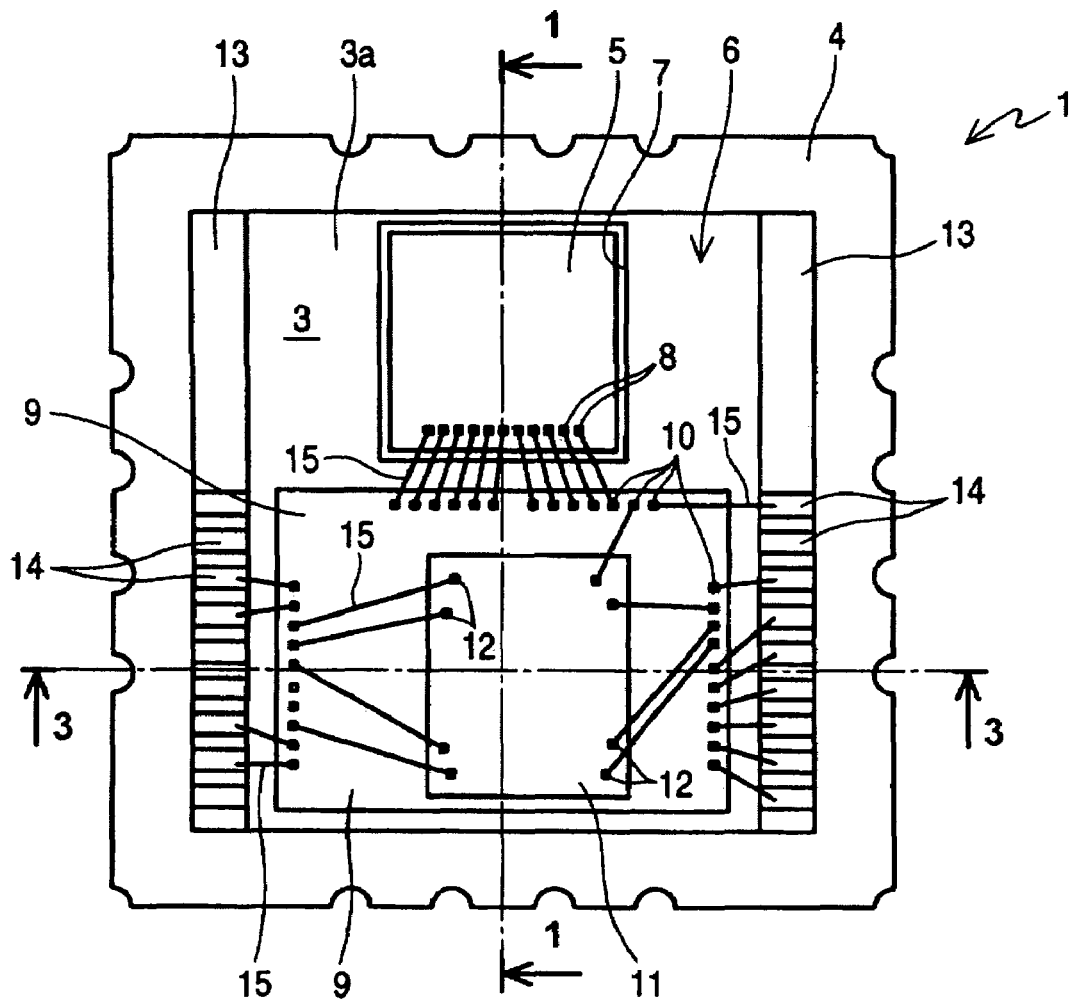
FIG. 2 is a plan view of the semiconductor package according to the first embodiment of the present invention, wherein a sealing lid shown in FIG. 1 is removed.
Figure 3:
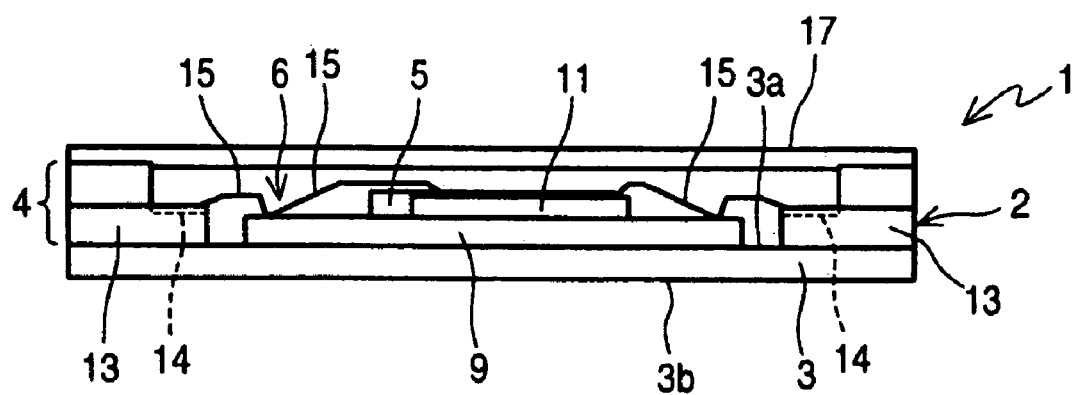
FIG. 3 is a sectional view of the semiconductor package according to the first embodiment of the present invention taken along a line 3-3 in FIG. 2.
Figure 4:
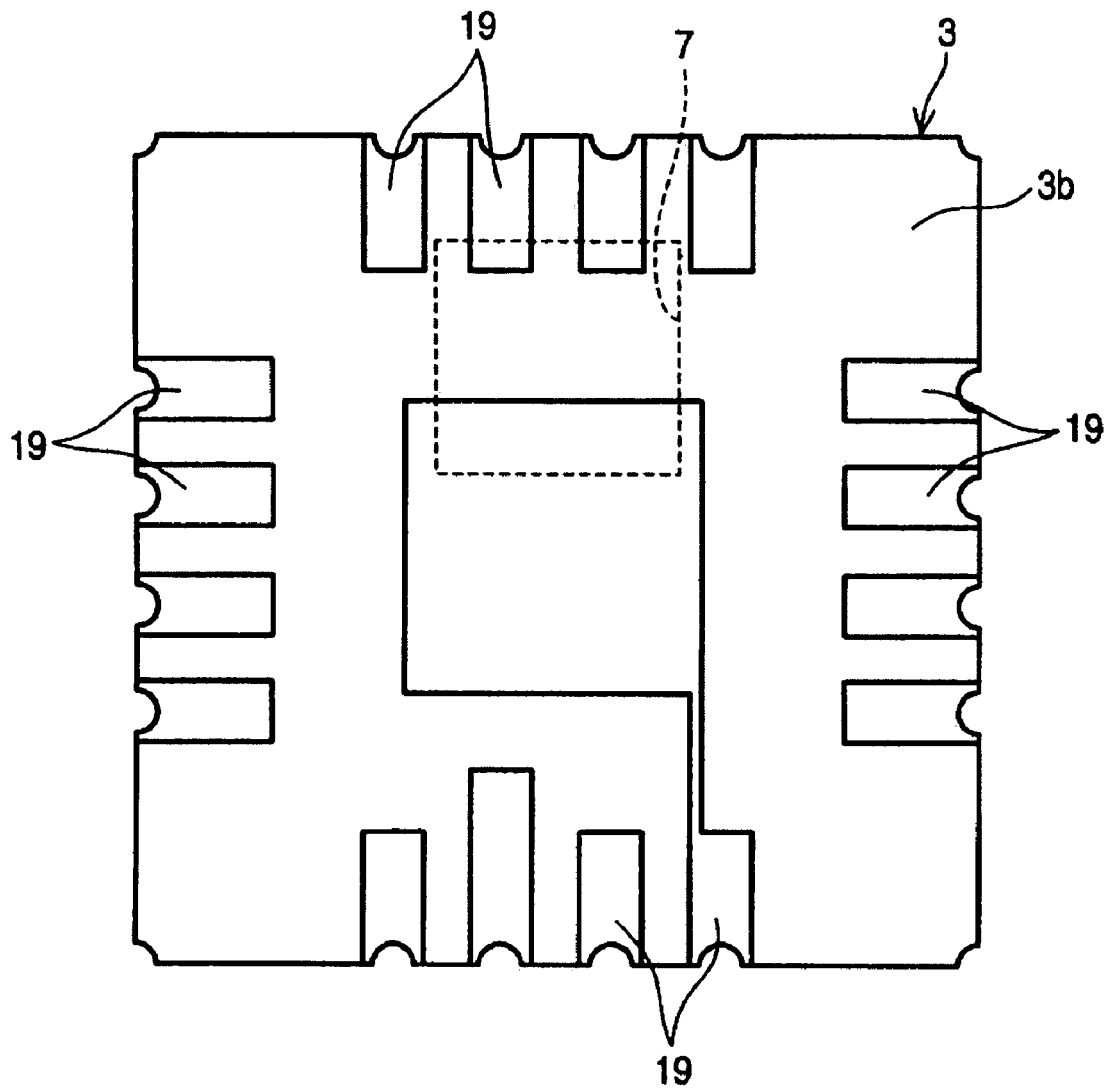
FIG. 4 is a bottom view of the semiconductor package according to the first embodiment of the present invention.
Figure 5:
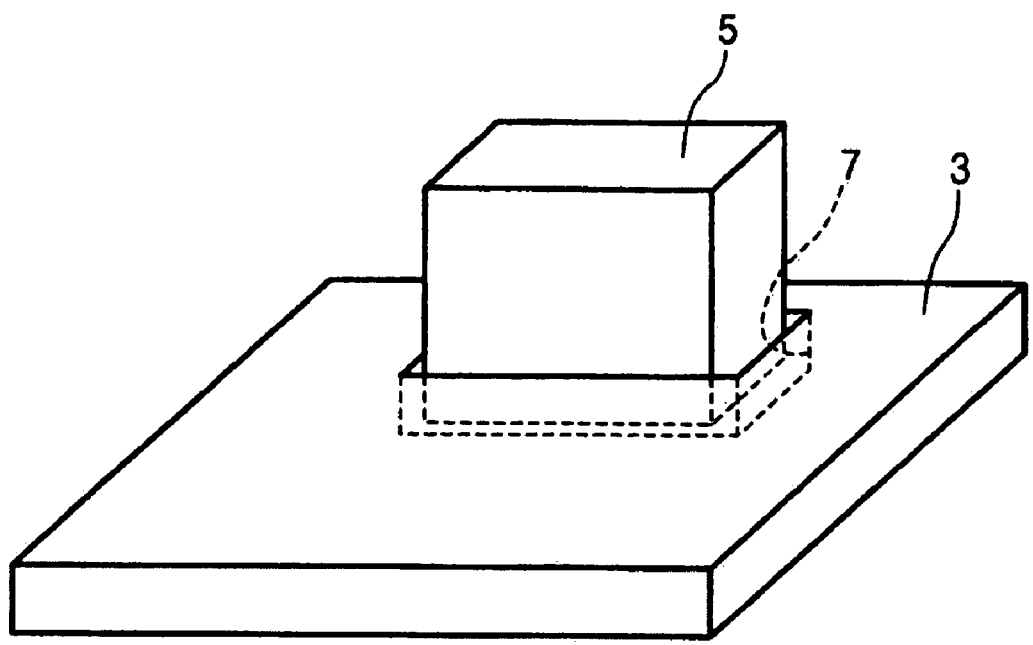
FIG. 5 is a perspective view of a sensor chip according to the first embodiment of the present invention in an installed state.

FIG. 1 is a sectional view of a semiconductor package according to a first embodiment of the present invention taken along a line 1-1 in FIG. 2. FIG. 2 is a plan view of the semiconductor package according to the first embodiment of the present invention, wherein a sealing lid shown in FIG. 1 is removed. FIG. 3 is a sectional view of the semiconductor package according to the first embodiment of the present invention taken along a line 3-3 in FIG. 2. FIG. 4 is a bottom view of the semiconductor package according to the first embodiment of the present invention. FIG. 5 is a perspective view of a sensor chip according to the first embodiment of the present invention in an installed state.

In FIGS. 1-3, reference numeral 1 denotes a semiconductor package, and reference numeral 2 denotes a case made of a ceramic or other material and having a base plate 3 and a sidewall 4 bonded at the periphery of the base plate 3 in a frame shape. A space surrounded by the sidewall 4 functions as a chip accommodation space 6 for accommodating a sensor chip 5 and a signal processing chip 9. A front surface 3a of the base plate 3 includes a sensor chip installation region and a signal processing chip installation region.

The sensor chip installation region is a recess or a hole 7 (chip installation hole 7) having a bottom, and provided in the front surface 3a of the base plate 3 in the chip accommodation space 6. The chip installation hole 7 has a rectangular shape and a size substantially same as that of the sensor chip 5, so that the sensor chip 5 can be installed therein. A plurality of pads 8, which is electrically connected to predetermined points of inner circuits of the sensor chip 5, is provided on the front surface of the sensor chip 5.

The signal processing chip 9 is installed in the signal processing chip installation region on the front surface 3a and processes signals from the sensor chip 5. A plurality of pads 10, which is electrically connected to predetermined points of inner circuits of the signal processing chip 9, is provided on a front surface of the signal processing chip 9.

A memory chip 11 is installed on the front surface of the signal processing chip 9 to store a correction value for correcting an output signal from the sensor chip 5 when the signal processing chip 9 processes the signal. A plurality of pads 12, which is electrically connected to predetermined points of inner circuits of the memory chip 11, is provided on a front surface of the memory chip 11.

In the embodiment, the sensor chip 5 is a semiconductor acceleration sensor and has a thickness of substantially 500 μm. A thickness of the base plate 3 is approximately 200 μm, and a depth of the chip installation hole 7 provided in the front surface 3a of the base plate 3 is approximately 50 to 100 μm. A thickness of the signal processing chip 9 and the memory chip 11 is about 150 μm.

Terminal arrangement plates 13 are provided on the front surface 3a of the base plate 3 of the case 2 at lower portions of the sidewall 4 to form a frame shape. Two opposite portions of the terminal arrangement plates 13 extend into the chip accommodation space 6. A plurality of inner terminals 14 is provided on the front surfaces of the terminal arrangement plates 13.

The inner terminals 14 are electrically connected to the pads 8 and 10 of the sensor and signal processing chips 5 and 9 by wires 15. The wires 15 are elongated leads made of a conductive metal, such as gold, nickel, and tungsten. The pads 8 of the sensor chip 5 and the pads 10 of the signal processing chip 9 are electrically connected to each other through the wires 15. The pads 12 of the memory chip 11 and the pads 10 of the signal processing chip 9 are electrically connected to each other through the wires 15.

A bond layer 16 is formed of a die bonding agent having a high viscosity, such as epoxy, silicon, and acryl. The die bonding agent is applied onto the bottom of the chip installation hole 7 provided in the base plate 3, and a lower surface of the sensor chip 5 is adhered to the bond layer 16. After hardening the die bonding agent, the sensor chip 5 is fixed to the chip installation hole 7.

A sealing lid 17 is made of a ceramic or a metal, and adhered to an upper end surface of the sidewall 4 such that the sealing lid 17 covers an opening portion of the chip accommodation space 6, opposing to the upper surface of the sensor chip 5. For attaching the sealing lid 17, a bonding agent or a paste agent, such as a silver paste, is applied onto the upper end surface of the sidewall 4 and hardened after the sealing lid 17 is installed on the bonding or paste agent.

As shown in FIG. 4, a plurality of outer terminals 19 is provided on a back surface 3b of the base plate 3 for relaying signals between the outside circuits and the semiconductor package 1 electrically connected to the inner terminals 14 inside the case 2. The outer terminals 19 are directly connected to wiring terminals of a mounting board (not shown) having the outer circuits by soldering. Thus, the outer circuits are electrically connected to the inner circuits of the sensor chip 5 and the signal processing chip 9 through the outer terminals 19, inner terminals 14, wires 15, and pads 8 and 10.

As described above, the die bonding agent is applied in the sensor chip installation region on the bottom surface of the chip installation hole 7 provided in the front surface 3a of the base plate 3 of the case 2. The sensor chip 5 is inserted into the chip installation hole 7, and the lower surface of the sensor chip 5 is adhered to the bottom of the chip installation hole 7. The sensor chip 5 is fixed or bonded to the bottom of the chip installation hole 7 formed in the base plate 3 of the case 2 through the bond layer 16 after setting the die bonding agent.

The signal processing chip 9 is bonded to the front surface 3a of the base plate 3 by a die bonding agent provided in the signal processing chip installation region, and the memory chip 11 is bonded to the upper surface of the signal processing chip 9 by a die bonding agent. Thus, the signal processing chip 9 is installed on the front surface 3a of the base plate 3 with the memory chip 11 bonded on the signal processing chip 9.

The pads 8 of the sensor chip 5 and the pads 10 of the signal processing chip 9, the pads 10 of the signal processing chip 9 and the inner terminals 14, and the pads 12 of the memory chip 11 and the pads 10 of the signal processing chip 9 are electrically connected to each other, respectively, by the wires 15 using a wire bonder. Then the sealing lid 17 is bonded on the upper end surface of the sidewall 4 to seal the opening of the chip accommodation space 6. Accordingly, the semiconductor package 1 accommodates the sensor chip 5, signal processing chip 9, and memory chip 11 in the sealed chip accommodation space 6.

As described above, in the embodiment, the sensor chip is installed in the chip installation hole provided in the base plate of the case. Accordingly, the thickness of the semiconductor package can be reduced without changing the thickness of the sensor chip. The base plate has a relatively thick portion except for the chip installation hole. Accordingly, even when the semiconductor package is made thinner, the rigidity of the base plate is maintained, thereby reducing a strain in the base plate and preventing an influence of an external force on the sensor chip.

In the embodiment, the sensor chip is installed at a level lower than that of other semiconductor chips such as the signal processing chip. As a result, a height or level of the pads of the sensor chip becomes close to a height or level of the pads of the signal processing chip. Accordingly, it is possible to effectively bond the wires between the pads of the sensor and signal processing chips.

Figure 6:
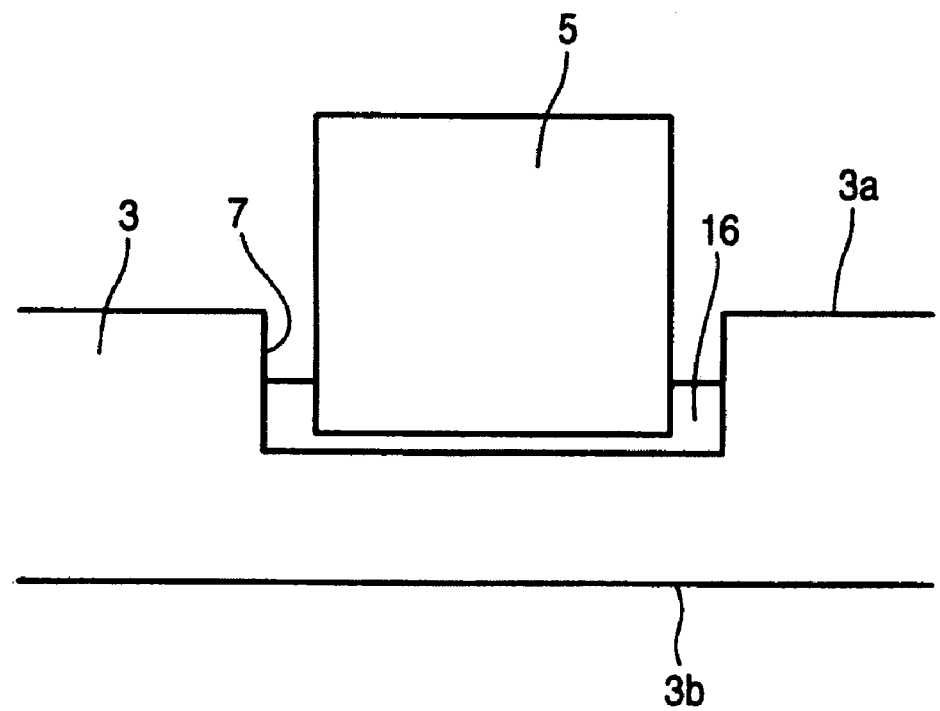
FIG. 6 is a side view of the sensor chip according to the first embodiment of the present invention in another installed state.

In the embodiment, the lower surface of the sensor chip 5 is bonded to the sensor chip installation region on the bottom of the chip installation hole 7 by the bond layer. Alternatively, as shown in FIG. 6, a large quantity of a die bonding agent having a high viscosity may be filled in the chip installation hole 7. In this case, when the sensor chip 5 is installed on the die bonding agent, the die bonding agent is forced out to a space between side surfaces of the sensor chip 5 and the chip installation hole 7 to form a thick bonding layer 16. When the bonding layer 16 has a thick bonding layer, although the bonding layer 16 has a lower rigidity, it can reduce the influence of an external force on the sensor chip 5.

Second Embodiment

Figure 7:
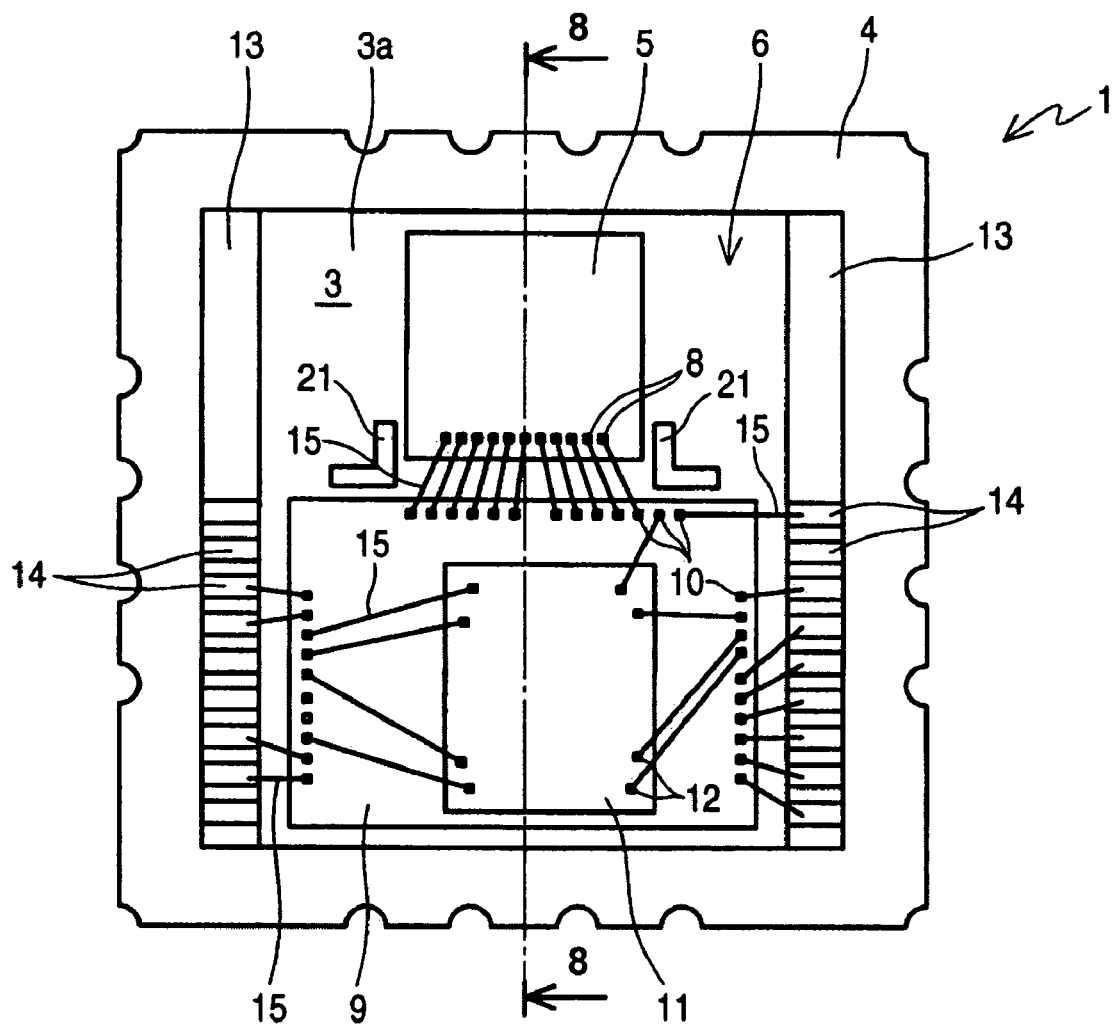
FIG. 7 is a plan view of a semiconductor package according to a second embodiment of the present invention, wherein a sealing lid shown in FIG. 8 is removed.
Figure 8:
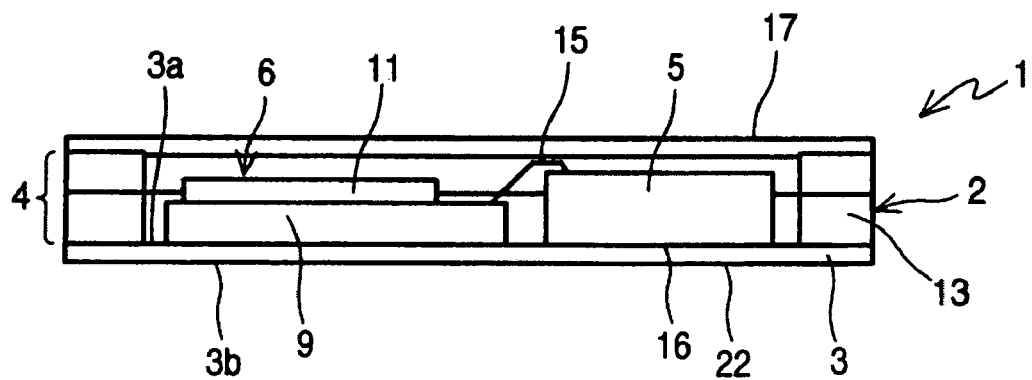
FIG. 8 is a sectional view of the semiconductor package according to the second embodiment of the present invention taken along a line 8-8 in FIG. 7.
Figure 9:
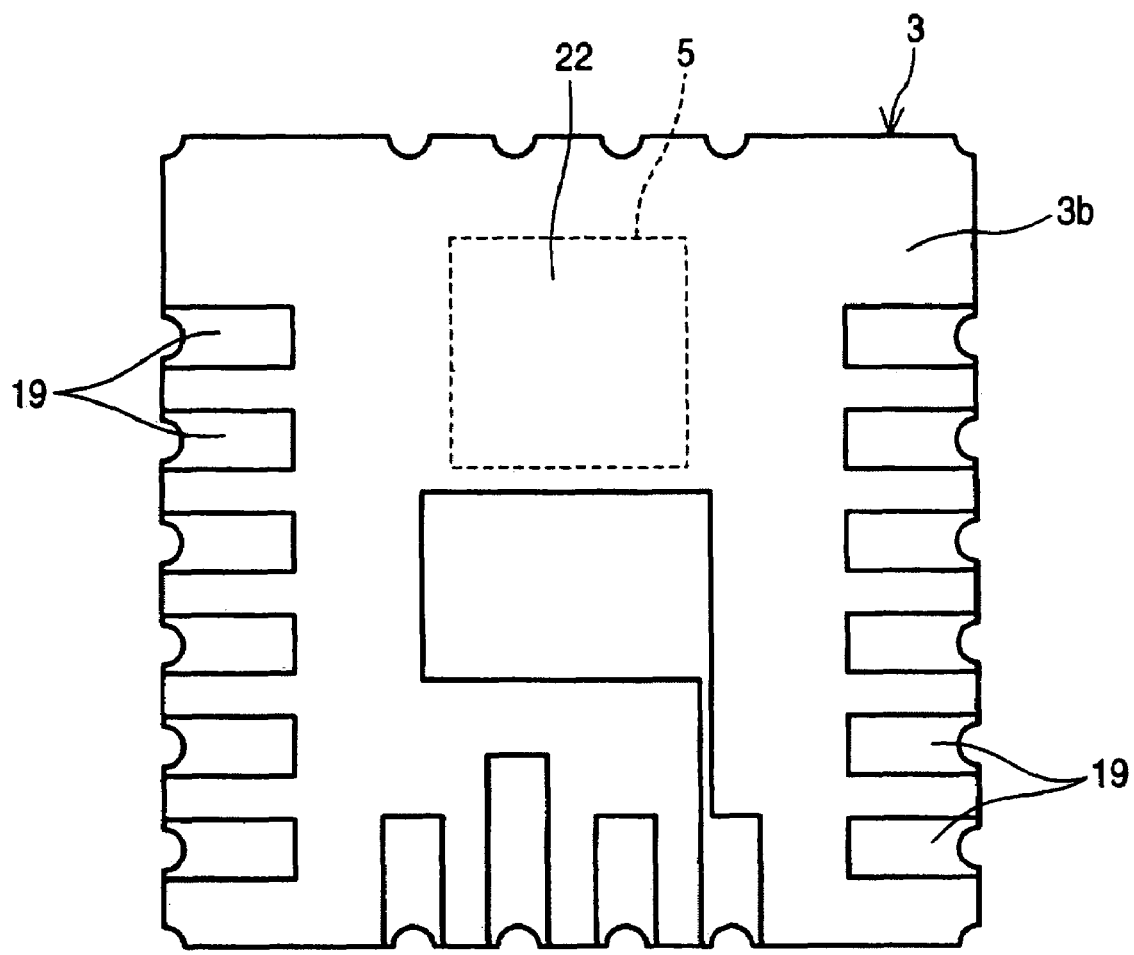
FIG. 9 is a bottom view of the semiconductor package according to the second embodiment of the present invention.

FIG. 7 is a plan view of a semiconductor package according to a second embodiment of the present invention. FIG. 8 is a sectional view of the semiconductor package according to the second embodiment of the present invention taken along a line 8-8 in FIG. 7. FIG. 9 is a bottom view of the semiconductor package according to the second embodiment of the present invention.

In FIGS. 7-9, elements same as or similar to those in the first embodiment have the same reference numerals and the description thereof is omitted.

As shown FIG. 7, an adjustment mark 21 is provided on the front surface 3a of the base plate 3 of the case 2 for indicating an installation position of the sensor chip 5, or the sensor chip installation region.

As shown in FIG. 8, according to the second embodiment, the base plate 3 has a thickness substantially equal to that of the chip installation hole in the first embodiment. That is, in the second embodiment, the base plate 3 has the thickness smaller than that of the base plate 3 in the first embodiment.

As shown in FIG. 9, the outer terminals 19 are provided on the back surface 3b of the base plate 3 at positions different from those in the first embodiment shown in FIG. 4. That is, in the second embodiment, the number of the outer terminals 19 is same as that of the outer terminals 19 in the first embodiment. Further, in the second embodiment, the outer terminals 19 are provided at positions in a region other than a region 22 on the back surface 3b, wherein the region 22 corresponds to the sensor chip installation region on the front surface 3a.

The sensor chip 5 is installed at the sensor chip installation region indicated by the adjustment mark 21. The lower surface of the sensor chip 5 is adhered to the front surface 3a of the base plate 3 by a die bonding agent provided in the sensor chip installation region. The sensor chip 5 is fixed or bonded to the front surface 3a of the base plate 3 by the bond layer 16 formed after the die bonding agent is set.

The signal processing chip 9 and the memory chip 11 are bonded in a way similar to that in the first embodiment. The pads 8, 10, and 12 are connected to the inner terminals 14 in a way similar to that in the first embodiment. Further, the sealing lid 17 is bonded in a way similar to that in the first embodiment. Accordingly, descriptions thereof are omitted. With the configuration described above, the semiconductor package 1 having the relatively thin base plate 3 accommodates the sensor chip 5, signal processing chip 9, and memory chips 11 in the sealed chip accommodation space 6.

As described above, in the second embodiment, the outer terminals are provided on the back surface of the base plate at positions except for a region corresponding to the sensor chip installation region on the front surface of the base plate. As a result, even when the base plate has a relatively small thickness, various external forces from a mounting board are not directly applied to the sensor chip after soldering the semiconductor package to the mounting board. Accordingly, it is possible to reduce a strain in the base plate in the sensor chip installation region and prevent the influence of an external force on the sensor chip. Further, it is possible to reduce the thickness of the semiconductor package without changing the thickness of the sensor chip.

When the outer terminals according to the second embodiment are disposed on the back surface of the base plate in the first embodiment, the influence of an external force on the sensor chip in the first embodiment can be further reduced. Namely, the above-described configuration of the outer terminals is effective in the first embodiment as well as the second embodiment and the influence of an external force on the sensor chip provided on the front surface of the base plate is minimized.

In the above embodiments, the sensor, signal processing, and memory chips are enclosed in the chip accommodation space. The number of the chips is not limited to the description. Even when the number of the chips is two or more than three, the similar effect may be obtained according to the present invention.

In the above embodiments, the sensor chip is a semiconductor acceleration sensor, and may be any other semiconductor chip as far as the semiconductor chip receives an influence through a strain in the base plate. The similar effect can be obtained when the present invention is applied to such a semiconductor chip.

The disclosure of Japanese Patent Application No. 2005-079766, filed on Mar. 18, 2004, is incorporated in the application.

While the invention has been explained with reference to the specific embodiments of the invention, the explanation is illustrative and the invention is limited only by the appended claims.

What is claimed is:

1. A semiconductor package comprising:
   a base plate having a front surface and a back surface, said front surface having a sensor chip installation hole and a signal processing chip installation region, said back surface being positioned closer to the front surface in the sensor chip installation hole than the front surface in the signal processing chip installation region;
   a sidewall provided at a periphery of the base plate for defining a chip accommodation space;
   a sensor chip accommodated in the chip accommodation space and retained in the sensor chip installation hole; and
   a signal processing chip accommodated in the chip accommodation space and mounted in the signal processing chip installation region.

2. A semiconductor package comprising:
a base plate having a front surface and a back surface;
a sensor chip installation region provided on the front surface for installing a sensor chip; and
a signal processing chip installation region provided on the front surface for installing a signal processing chip processing a signal from the sensor chip,
wherein said base plate has a thickness between the front surface and the back surface in the sensor chip installation region smaller than that in the signal processing chip installation region.

3. The semiconductor package according to claim 2, further comprising a sidewall provided at a periphery of the base plate for surrounding the sensor chip installation region and the signal processing chip installation region, and a sealing lid attached to the sidewall for enclosing the sensor chip and the signal processing chip.

4. The semiconductor package according to claim 2, further comprising an outer terminal provided on the back surface at a position in an area corresponding to an area on the front surface other than the sensor chip installation region, said outer terminal relaying a signal externally.

5. The semiconductor package according to claim 1, further comprising a sealing lid attached to the sidewall for enclosing the sensor chip.

6. The semiconductor package according to claim 1, further comprising an outer terminal provided on the back surface of the base plate.

7. The semiconductor package according to claim 1, wherein said sidewall is adapted to define a space for accommodating the signal processing chip.

8. The semiconductor package according to claim 1, wherein said sidewall is adapted to define a space for accommodating a memory chip.

9. The semiconductor package according to claim 3, wherein said sidewall is adapted to define a space for accommodating a memory chip.

10. The semiconductor package according to claim 1, wherein said sidewall is adapted to define a space for accommodating four or more semiconductor chips including the sensor chip, the signal processing chip, a memory chip, and other semiconductor chips.

11. The semiconductor package according to claim 3, wherein said sidewall is adapted to define a space for installing semiconductor chips other than the sensor and signal processing chips.

12. The semiconductor package according to claim 1, further comprising a wire electrically connected to the sensor chip.

13. The semiconductor package according to claim 4, further comprising a wire electrically connected to the sensor chip and the signal processing chip.

14. The semiconductor package according to claim 6, further comprising a wire electrically connected to the outer terminal.

15. The semiconductor package according to claim 4, further comprising a wire electrically connected to the outer terminal.

16. The semiconductor package according to claim 1, wherein said sensor chip includes a semiconductor acceleration sensor.

17. The semiconductor package according to claim 2, wherein said sensor chip includes a semiconductor acceleration sensor.

18. The semiconductor package according to claim 1, further comprising an adjusting mark provided on the front surface of the base plate for indicating the sensor chip installation region.

19. The semiconductor package according to claim 2, further comprising an adjusting mark provided on the front surface for indicating the sensor chip installation region.

* * * * *